(12) United States Patent
Cho

(10) Patent No.: US 9,468,102 B2
(45) Date of Patent: Oct. 11, 2016

(54) DISPLAY DEVICE

(71) Applicant: Samsung Electronics Co., Ltd., Suwon-si (KR)

(72) Inventor: KyongSoon Cho, Incheon (KR)

(73) Assignee: Samsung Electronics Co., Ltd. (KR)

( * ) Notice: Subject to any disclaimer, the term of this patent is extended or adjusted under 35 U.S.C. 154(b) by 253 days.

(21) Appl. No.: 14/291,684

(22) Filed: May 30, 2014

(65) Prior Publication Data

US 2014/0369009 A1 Dec. 18, 2014

(30) Foreign Application Priority Data

Jun. 18, 2013 (KR) .................. 10-2013-0069738

(51) Int. Cl.
*H05K 1/11* (2006.01)
*H05K 1/18* (2006.01)
*G02F 1/1345* (2006.01)

(52) U.S. Cl.
CPC ........... *H05K 1/118* (2013.01); *G02F 1/13452* (2013.01); *H05K 1/189* (2013.01); *H05K 2201/09409* (2013.01); *H05K 2201/09709* (2013.01); *H05K 2201/10128* (2013.01)

(58) Field of Classification Search
CPC ...... H05K 1/118; H05K 1/111; H05K 1/181; H05K 2201/10734
See application file for complete search history.

(56) References Cited

U.S. PATENT DOCUMENTS

| | | | |
|---|---|---|---|
| 6,586,873 B2 | 7/2003 | Mizutani et al. | |
| 6,656,772 B2 | 12/2003 | Huang | |
| 7,087,844 B2 | 8/2006 | Ishimaru et al. | |
| 7,285,734 B2 * | 10/2007 | Imamura | H01L 21/4853 174/260 |
| 7,370,943 B2 | 5/2008 | Imai et al. | |
| 7,394,164 B2 * | 7/2008 | Peng | H01L 24/14 257/48 |
| 7,399,192 B2 | 7/2008 | Yamamoto | |
| 7,400,515 B2 | 7/2008 | Sakamoto et al. | |
| 7,582,968 B2 | 9/2009 | Shimoishizaka et al. | |
| 2001/0015347 A1* | 8/2001 | Terunuma | H01R 12/592 219/121.64 |
| 2002/0140654 A1* | 10/2002 | Kim | G02F 1/13452 345/87 |
| 2005/0040504 A1* | 2/2005 | Kang | G02F 1/13452 257/678 |
| 2005/0088830 A1* | 4/2005 | Yumoto | G02F 1/13452 361/749 |
| 2005/0116339 A1* | 6/2005 | Uchida | H01L 23/49838 257/735 |
| 2005/0139387 A1* | 6/2005 | Nishi | H01L 23/49816 174/260 |

(Continued)

FOREIGN PATENT DOCUMENTS

| | | |
|---|---|---|
| JP | 06268014 | 9/1994 |
| JP | 10256681 | 9/1998 |
| KR | 2000063735 | 11/2000 |

*Primary Examiner* — Jeremy C Norris
*Assistant Examiner* — Nathan Milakovich
(74) *Attorney, Agent, or Firm* — Onello & Mello, LLP

(57) ABSTRACT

A display device includes a display panel including panel bumps, a flexible circuit film connected to the display panel and including a chip, and panel bonding leads connecting the display panel to the chip. The panel bumps include first panel bumps arranged along a first row, and second panel bumps arranged along a second row which is spaced apart from the first row toward the chip. Each second panel bump is disposed between two adjacent first panel bumps when viewed from a column direction perpendicular to a row direction. The panel bonding leads includes first panel bonding leads connected to the first panel bumps and second panel bonding leads connected to the second panel bumps. Each first panel bonding lead includes a first portion having a first thickness, and a second portion adjacent to the second panel bump having a second thickness smaller than the first thickness.

18 Claims, 8 Drawing Sheets

(56) References Cited

U.S. PATENT DOCUMENTS

| | | | |
|---|---|---|---|
| 2005/0276912 A1* | 12/2005 | Yamamoto | H01L 21/28008 427/117 |
| 2007/0134473 A1* | 6/2007 | Kim | H05K 1/0281 428/209 |
| 2008/0169560 A1* | 7/2008 | Kim | H01L 23/49572 257/737 |
| 2009/0020316 A1 | 1/2009 | Wu et al. | |
| 2011/0049514 A1 | 3/2011 | Sasaki et al. | |
| 2011/0049688 A1* | 3/2011 | Sasaki | H01L 23/4985 257/668 |
| 2012/0021600 A1 | 1/2012 | Han et al. | |
| 2013/0293816 A1* | 11/2013 | Jung | H01L 23/49827 349/139 |
| 2013/0314883 A1* | 11/2013 | Ling | H05K 7/026 361/749 |

* cited by examiner

DISPLAY DEVICE

CROSS-REFERENCE TO RELATED APPLICATION

This U.S. non-provisional patent application claims priority under 35 U.S.C. §119 to Korean Patent Application No. 10-2013-0069738, filed on Jun. 18, 2013, in the Korean Intellectual Property Office, the contents of which are herein incorporated by reference in their entirety.

BACKGROUND

Example embodiments of the present inventive concepts relate to display devices.

A liquid crystal display device requires an additional light source. Unlike the liquid crystal display device, organic light emitting diode (OLED) display devices do not need an additional light source because of their self-light emitting properties. Thus, thicknesses and weights of the OLED display devices may be reduced. Additionally, the OLED display devices have high quality characteristics such as low power consumption, high brightness, and high response speed. Therefore, OLED display devices are effective as next generation display devices of portable electronic devices.

Generally, the OLED display device includes two substrates combined with each other, a display panel assembly within which organic light emitting diodes are formed, and a printed circuit board electrically connected to the display panel assembly through a flexible circuit board.

Recently, flexible-OLED panels have been introduced to display panels of portable phones. A chip-on-film (COF) technique is applied in order to improve slimming characteristics of display devices at a module level and a set level.

SUMMARY

Example embodiments of the present inventive concepts may provide integrated and miniaturized display devices.

According to one aspect of the present inventive concepts, a display panel may include: a display panel including a plurality of panel bumps; a flexible circuit film connected to the display panel, a chip on the flexible circuit film; and a plurality of panel bonding leads electrically connecting the display panel to the chip and extending in one direction. The panel bumps may include: first panel bumps spaced apart from each other along a first row of panel bumps; and second panel bumps spaced apart from each other along a second row of panel bumps. The second row of panel bumps is spaced apart from the first row of panel bumps toward the chip. Each of the second panel bumps may be between two adjacent first panel bumps in a column direction perpendicular to a row direction of the first and second rows of panel bumps. The panel bonding leads may include: first panel bonding leads connected to the first panel bumps; and second panel bonding leads connected to the second panel bumps. Each of the first panel bonding leads may include: a first portion having a first thickness; and a second portion having a second thickness smaller than the first thickness, the second portions of the first panel bonding leads being adjacent to the second panel bumps.

In some embodiments, each of the second panel bonding leads may have the first thickness.

In some embodiments, the display device may further include: a circuit board connected to the flexible circuit film, the circuit board including a plurality of circuit board (CB) bumps; and circuit board (CB) bonding leads electrically connecting the chip to the circuit board. The CB bumps may include: first CB bumps spaced apart from each other along a first row of CB bumps; and second CB bumps spaced apart from each other along a second row of CB bumps. The second row of CB bumps is spaced apart from the first row of the CB bumps toward the chip. Each of the second CB bumps may be between two adjacent first CB bumps in a column direction perpendicular to a row direction of the first and second rows of the CB bumps. The CB bonding leads may include: first CB bonding leads connected to the first CB bumps; and second CB bonding leads connected to the second CB bumps. Each of the first CB bonding leads may include: a first portion having a third thickness; and a second portion having a fourth thickness smaller than the third thickness, the second portions of the first CB bonding leads adjacent to the second CB bumps.

In some embodiments, each of the second CB bonding leads may have the third thickness.

In some embodiments, the flexible circuit film may be bent so that the display panel and the circuit board may face each other.

According to another aspect of the present inventive concepts, a display device may include: a display panel including a plurality of panel bumps; a circuit board including a plurality of circuit board (CB) bumps, the circuit board facing and spaced apart from the display panel; a bent flexible circuit film electrically connecting the display panel to the circuit board, a chip mounted on the bent flexible circuit film; panel bonding leads electrically connecting the panel bumps to the chip; and circuit board (CB) bonding leads electrically connecting the CB bumps to the chip. The panel bumps may include: first panel bumps spaced apart from each other along a first row of panel bumps; and second panel bumps arranged to be spaced apart from each other along a second row of panel bumps. The second row of panel bumps is spaced apart from the first row of panel bumps toward the chip. Each of the second panel bumps may be between two adjacent first panel bumps in a column direction perpendicular to a row direction of the first and second rows of panel bumps. The panel bonding leads may include: first panel bonding leads connected to the first panel bumps; and second panel bonding leads connected to the second panel bumps. Each of the first panel bonding leads may include: a first portion having a first thickness; and a second portion having a second thickness smaller than the first thickness. The second portions of the first panel bonding leads are adjacent to the second panel bumps.

In some embodiments, each of the second panel bonding leads may have the first thickness.

In some embodiments, the CB bumps may include: first CB bumps spaced apart from each other along a first row of CB bumps; and second CB bumps spaced apart from each other along a second row of CB bumps. The second row of CB bumps is spaced apart from the first row of the CB bumps toward the chip. Each of the second CB bumps may be between two adjacent first CB bumps in a column direction perpendicular to a row direction of the first and second rows of the CB bumps. The CB bonding leads may include: first CB bonding leads connected to the first CB bumps; and second CB bonding leads connected to the second CB bumps. Each of the first CB bonding leads may include: a first portion having a third thickness; and a second portion having a fourth thickness smaller than the third thickness. The second portions of the first CB bonding leads are adjacent to the second CB bumps.

In some embodiments, each of the second CB bonding leads may have the third thickness.

According to another aspect of the present inventive concepts, there is provided a display device including a display panel comprising a plurality of panel bumps, a flexible circuit film connected to the display panel, a chip on the flexible circuit film, and a plurality of panel bonding leads electrically connecting the display panel to the chip. The panel bumps include, first panel bumps spaced apart from each other along a first row of panel bumps along a row direction; and second panel bumps spaced apart from each other along a second row of panel bumps. The second row of panel bumps is spaced apart from the first row of panel bumps in a column direction. The first and second panel bumps are in a zigzag pattern, alternating between the second panel bumps in the second row of panel bumps and the first panel bumps in the first row of panel bumps. The panel bonding leads include first panel bonding leads connected to the first panel bumps, and second panel bonding leads connected to the second panel bumps. A thickness of a portion of the first panel bonding leads adjacent to the second panel bumps is smaller than a thickness of the remainder of the first panel bonding leads.

In some embodiments, each of the second panel bonding leads comprises the same thickness as the remainder of the first panel bonding leads.

In some embodiments, the display device further includes a circuit board connected to the flexible circuit film. The circuit board includes a plurality of circuit board (CB) bumps. The display device further includes circuit board (CB) bonding leads electrically connecting the chip to the circuit board. The CB bumps include first CB bumps spaced apart from each other along a first row of CB bumps in a row direction, and second CB bumps spaced apart from each other along a second row of CB bumps in a row direction. The second row of the CB bumps are spaced apart from the first row of the CB bumps in a column direction. The first and second CB bumps are in a zigzag pattern, alternating between the second CB bumps in the second row of CB bumps and the first CB bumps in the first row of CB bumps. The CB bonding leads include first CB bonding leads connected to the first CB bumps, and second CB bonding leads connected to the second CB bumps. A thickness of a portion of the first CB bonding leads adjacent to the second CB bumps is smaller than a thickness of the remainder of the first CB bonding leads.

In some embodiments, each of the second CB bonding leads comprises the same thickness as the remainder of the first CB bonding leads.

In some embodiments, the flexible circuit film is bent so that the display panel and the circuit board face each other.

In some embodiments, the display panel comprises a display substrate and a sealing substrate.

In some embodiments, the display substrate comprises a display region and a mounting region.

In some embodiments, the plurality of panel bumps are on the mounting region.

In some embodiments, the display device further includes a plurality of pixels in a matrix on the display region.

In some embodiments, the plurality of pixels comprise an organic light emitting element and a driving circuit part.

In some embodiments, the driving circuit part comprises a plurality of thin film transistors and at least one capacitor.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION OF THE EMBODIMENTS

Figure 1:
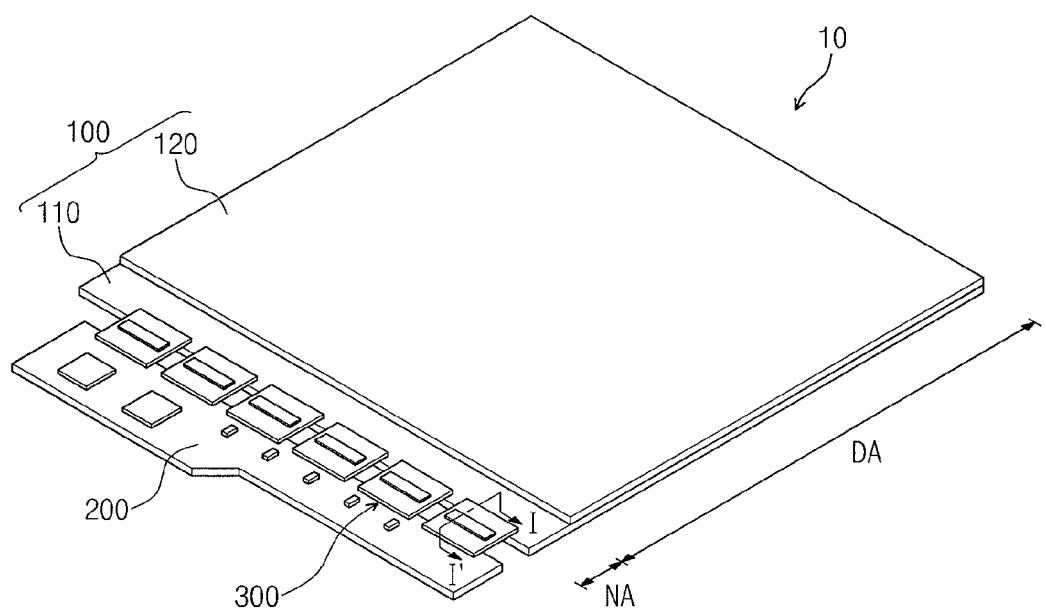
FIG. 1 is a perspective view illustrating a display device according to some embodiments of the present inventive concepts.

Various example embodiments will be described more fully hereinafter with reference to the accompanying drawings, in which some example embodiments are shown. The present inventive concepts may, however, be embodied in many different forms and should not be construed as limited to the example embodiments set forth herein.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Figure 2A:
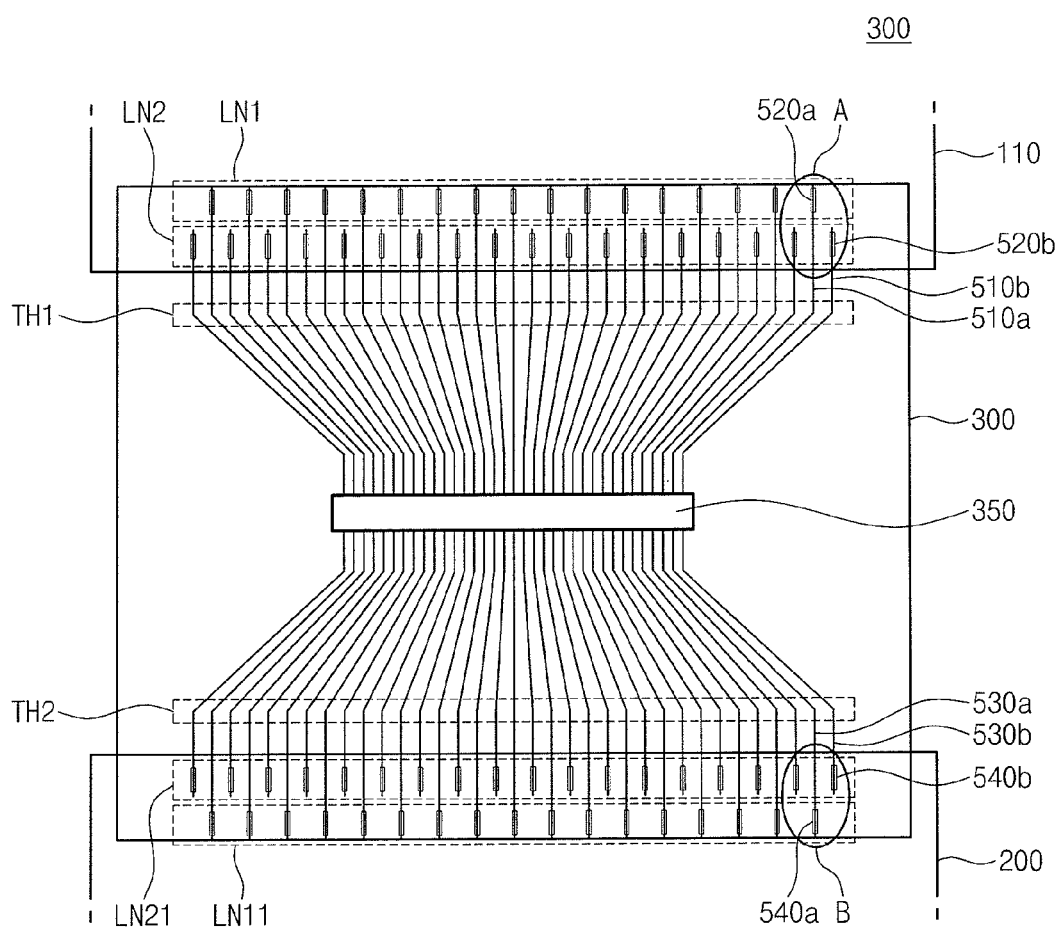
FIG. 2A is a plan view illustrating a flexible circuit film of the display device of FIG. 1 according to some embodiments of the present inventive concepts.
Figure 2B:
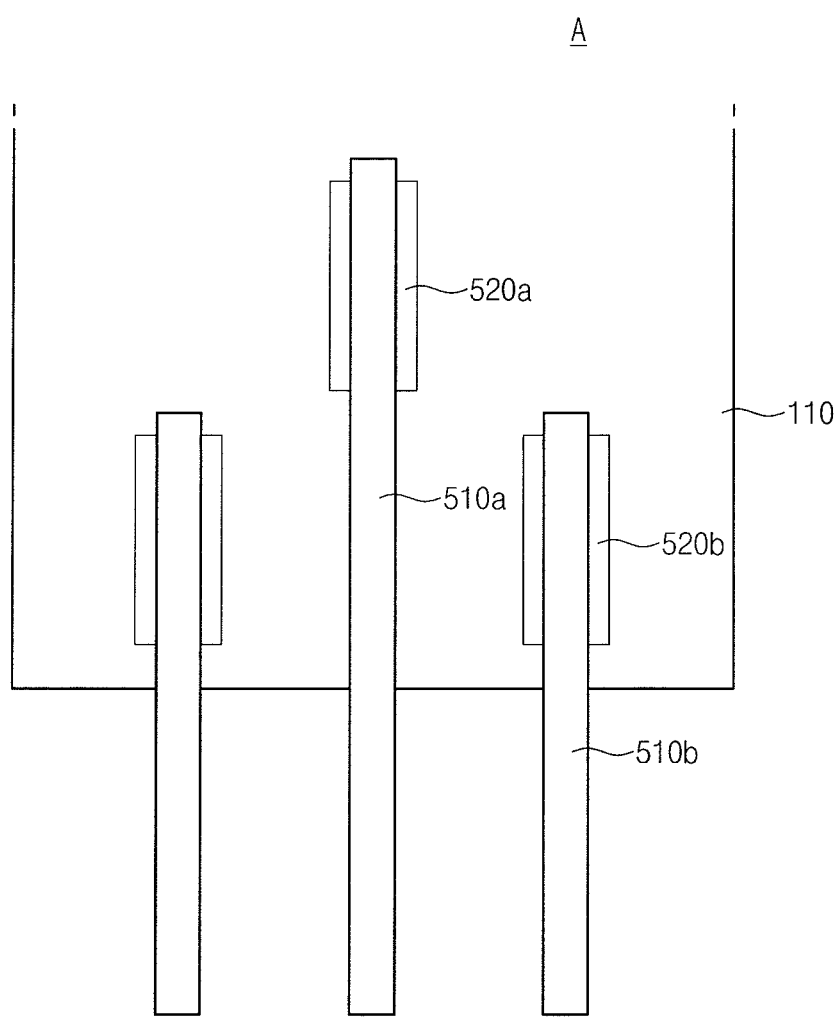
FIGS. 2B and 2C are a plan view and a perspective view, respectively, illustrating a portion 'A' of FIG. 2A according to some embodiments of the present inventive concepts.
Figure 2C:
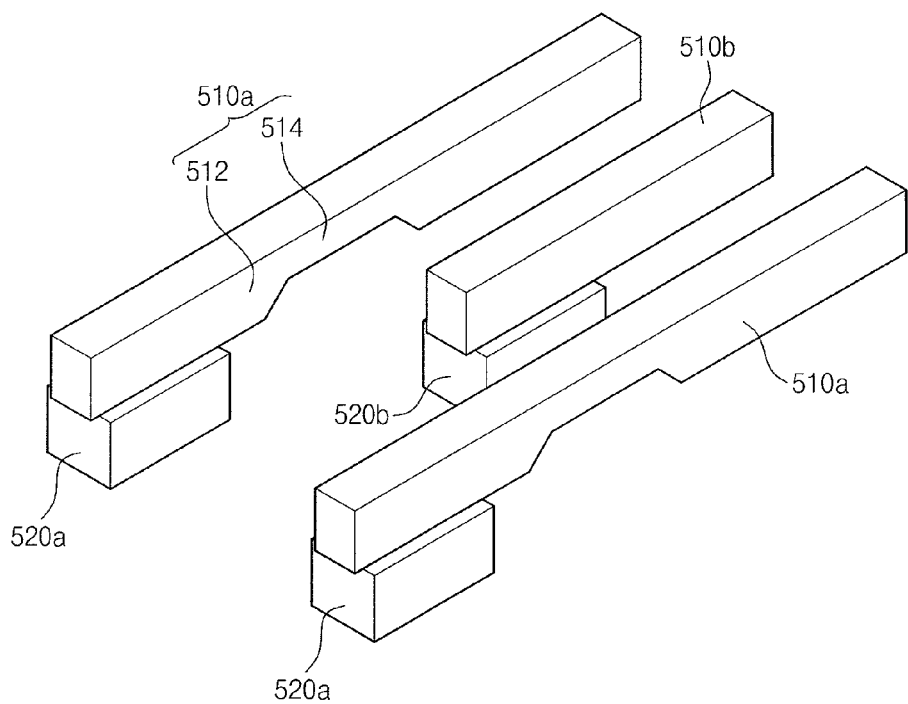
Figure 2D:
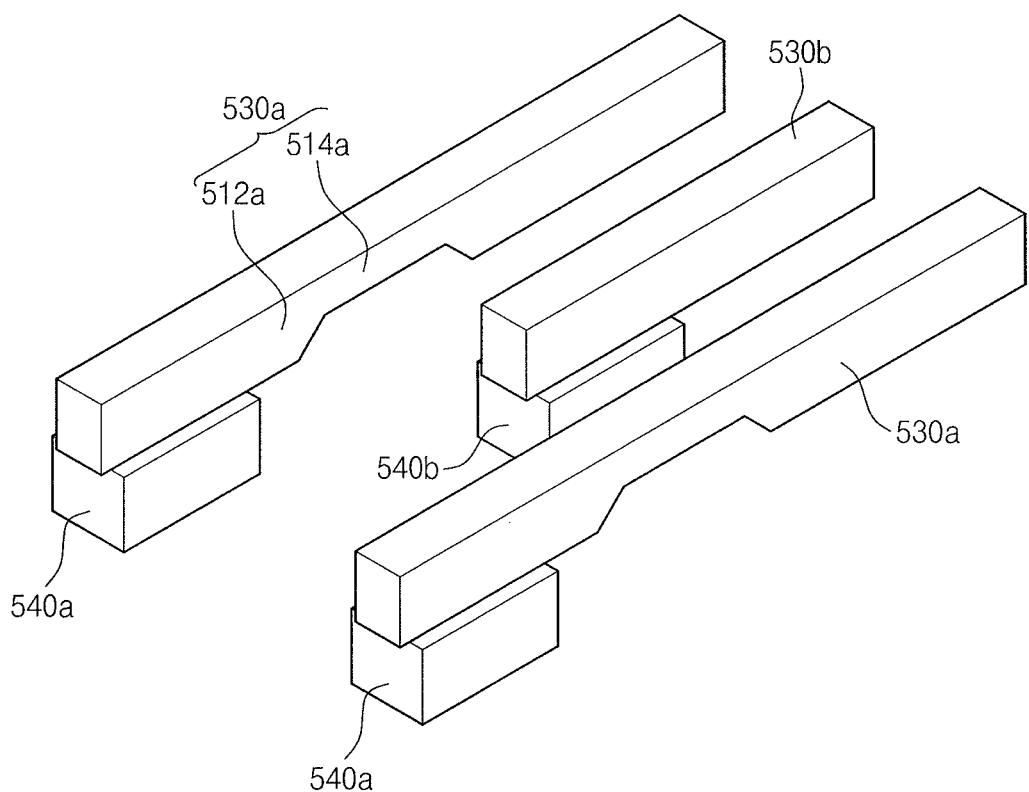
FIG. 2D is a perspective view illustrating a portion 'B' of FIG. 2A, according to some embodiments of the present inventive concepts.
Figure 3A:
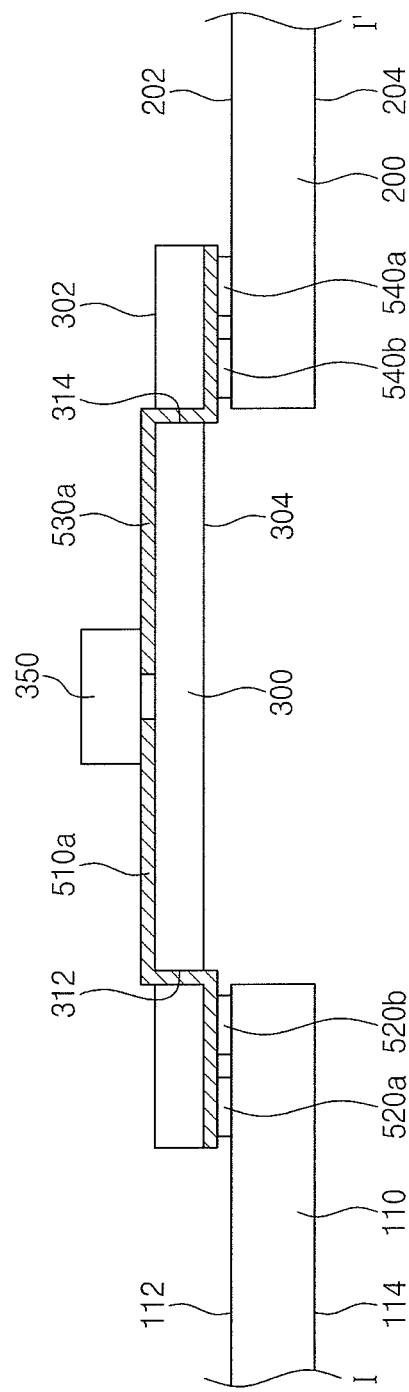
FIGS. 3A and 3B are cross-sectional views taken along a line I-I' of FIG. 1 according to some embodiments of the present inventive concepts.
Figure 3B:
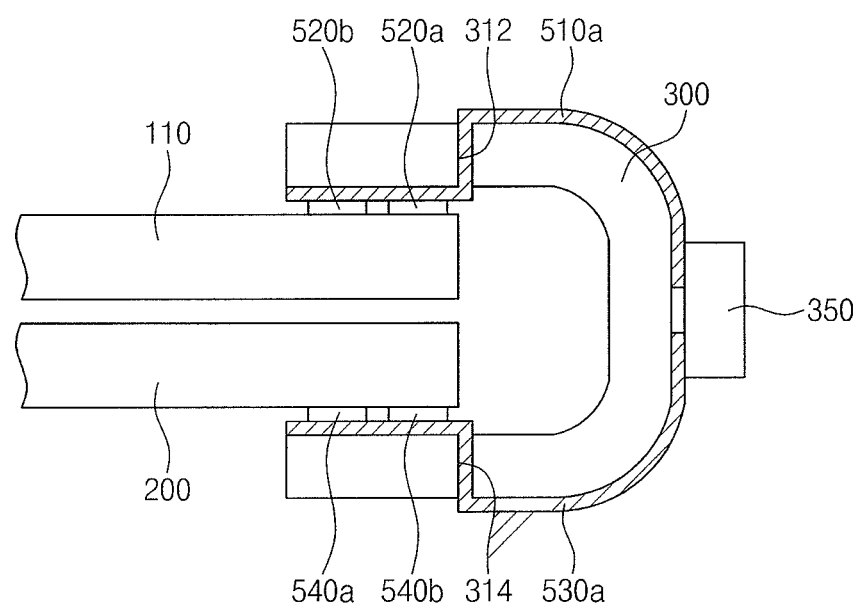

FIG. 1 is a perspective view illustrating a display device according to some embodiments of the present inventive concepts. FIG. 2A is a plan view illustrating a flexible circuit film of the display device of FIG. 1 according to some embodiments of the present inventive concepts. FIGS. 2B and 2C are a plan view and a perspective view, respectively, illustrating a portion 'A' of FIG. 2A according to some embodiments of the present inventive concepts. FIG. 2D is a perspective view illustrating a portion 'B' of FIG. 2A according to some embodiments of the present inventive concepts. FIGS. 3A and 3B are cross-sectional views taken along a line I-I' of FIG. 1 according to some embodiments of the present inventive concepts. Specifically, FIG. 3B is a cross-sectional view after a flexible circuit film of FIG. 3A is bent.

Referring to FIGS. 1, 2A, 2B, 2C, 3A, and 3B, a display device 10 may include a display panel 100, a circuit board (CB) 200, a flexible circuit film 300, panel bonding leads 510a and 510b, and CB bonding leads 530a and 530b.

The display panel 100 may include a display substrate 110 and a sealing substrate 120. The display substrate 110 may have a display region DA and a mounting region NA. The display substrate 110 may include a first surface 112 and a second surface 114 opposite to the first surface 112.

The sealing substrate 120 may face the first surface 112 of the display substrate 110, as illustrated in FIGS. 1 and 3A, and may be disposed on the display region DA of the display substrate 110. The sealing substrate 120 may be smaller than the display substrate 110. A portion of the display substrate 110 may extend beyond the sealing substrate 120 on one end and may be aligned with the sealing substrate 120 on the opposite end. The portion of the display substrate 110 extending beyond the sealing substrate 120 is the mounting region NA. The display substrate 110 and the sealing substrate 120 may be sealed and combined with each other by a sealant (not shown) disposed along an edge of the sealing substrate 120.

A plurality of panel bumps 520a and 520b may be disposed on the first surface 112 of the display substrate 110. According to some embodiments, the plurality of panel bumps 520a and 520b may be disposed on the mounting region NA of the first surface 112 of the display substrate 110. The plurality of panel bumps 520a and 520b may include a plurality of first panel bumps 520a arranged along a first row LN1 and a plurality of second panel bumps 520b arranged along a second row LN2, as illustrated in FIGS. 2A and 2B. The first panel bumps 520a are spaced apart from each other along the first row LN1 in a row direction. The second panel bumps 520b are spaced apart from each other along the second row LN2 in the row direction. The second row LN2 is spaced apart from the first row LN1 toward the flexible circuit film 300. That is, the first row LN1 is between the second row LN2 and the sealing substrate 120. The second panel bumps 520b may not overlap with the first panel bumps 520a in a column direction perpendicular to the row direction of the first and second rows LN1 and LN2. That is, each of the second panel bumps 520b may be disposed between two first panel bumps 520a adjacent to each other when viewed from the column direction. As illustrated in FIG. 2A, the plurality of panel bumps 520a and 520b are arranged along two rows LN1 and LN2. However, the inventive concepts are not limited to two rows of the panel bumps 520a and 520b. The panel bumps 520a and 520b are alternately arranged in zigzag form along the row direction, so that sufficient distances between the panel bumps 520a and 520b may be secured in a limited area. The panel bumps 520A and 520b are arranged in a zigzag pattern alternating between the second panel bumps 520b in the second row LN2 and the first panel bumps 520a in the first row LN1.

Figure 4:
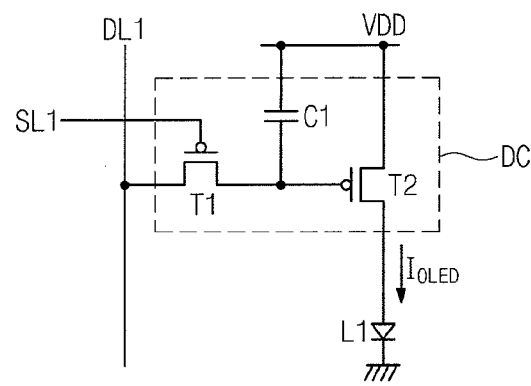
FIG. 4 is a circuit diagram of one pixel in the display device of FIG. 1 according to some embodiments of the present inventive concepts.

The display substrate 110 may include a plurality of pixels arranged in matrix form in the display region DA. FIG. 4 is a circuit diagram of one pixel in the display device of FIG. 1 according to some embodiments of the present inventive concepts. Each of the plurality of pixels may include an organic light emitting element L1, a plurality of thin film transistors T1 and T2, and at least one capacitor C1, as illustrated in FIG. 4. In the present example embodiment, the display panel 100 applied with organic light emitting diodes (OLEDs) is described as an example. In other embodiments, technical features of the display device may be applied to various display devices such as liquid crystal display (LCD) devices, photodiode (PD) devices, electro-luminescence (EL) devices, and vacuum fluorescent display (VFD) devices. That is, the display panel 100 of the display device according to the present inventive concepts is not limited to an OLED display panel.

The display substrate 110 may further include a scan driver (not shown) and a data driver (not shown) for driving the pixels. Additionally, the display substrate 110 may further include pad electrodes (not shown) disposed on the mounting region NA.

The circuit board 200 may be a printed circuit board (PCB). The circuit board 200 may include a first surface 202 and a second surface 204 opposite to the first surface 202, as illustrated in FIG. 3A.

As illustrated in FIGS. 2A and 3A, a plurality of CB bumps 540a and 540b may be disposed on the circuit board 200. According to some embodiments, the plurality of CB bumps 540a and 540b may be disposed on the first surface 202 of the circuit board 200. The plurality of CB bumps 540a and 540b may include a plurality of first CB bumps 540a arranged along a first row LN11 and a plurality of second CB bumps 540a arranged along a second row LN21. The first CB bumps 540a are spaced apart from each other along the first row LN11 in the row direction. The second CB bumps 540b are spaced apart from each other along the second row LN21 in the row direction. The second row LN21 of the CB bumps 540b is spaced apart from the first row LN11 of the CB bumps 540a toward the flexible circuit film 300. The second CB bumps 540b may not overlap with the first CB bumps 540a in a column direction perpendicular to the row direction of the rows LN11 and LN21 of the CB bumps 540a and 540b, respectively. That is, each of the second CB bumps 540b may be disposed between two first CB bumps 540a adjacent to each other when viewed from the column direction. As illustrated in FIG. 2A, the plurality of CB bumps 540a and 540b are arranged along two rows LN11 and LN21. However, the present inventive concepts are not limited to two rows of the CB bumps 540a and 540b. The CB bumps 540a and 540b may be alternately arranged in zigzag form, so that sufficient distances between the CB bumps 540a and 540b may be secured in a limited area. The CB bumps 540A and 540b are arranged in a zigzag pattern alternating between the second CB bumps 540b in the second row LN21 and the first CB bumps 540a in the first row LN11.

The circuit board 200 may include a driving circuit (not shown) processing image signals, and the driving circuit may convert image signals inputted from the outside into control signals for displaying an image. In some embodiments, the circuit board 200 may include a data printed circuit board (not shown) and a gate printed circuit board (not shown). In some embodiments, additional signal interconnections may be formed on the display substrate 110 and the flexible circuit film 300, so that the gate printed circuit board may be removed.

The flexible circuit film 300 may electrically connect the circuit board 200 and the display panel 100 to provide the control signals generated from the circuit board 200 to the display panel 100. The flexible circuit film 300 may include a first surface 302 and a second surface 304 opposite to the first surface 302, as illustrated in FIG. 3A.

According to some embodiments, the flexible circuit film 300 may further include a driving chip 350 disposed on the flexible circuit film 300. The driving chip 350 may be disposed on the first surface 302 of the flexible circuit film 300. The driving chip 350 may convert the control signals into driving signals for driving the thin film transistors T1 and T2. In this embodiment, the flexible circuit film 300 is called "a chip-on-film (COF)".

The display panel 100 and the circuit board 200 are connected to the second surface 304 of the flexible circuit film 300. Specifically, the first surface 112 of the display substrate 110 may be disposed to be adjacent to one end of the second surface 304 of the flexible circuit film 300. The first surface 202 of the circuit board 200 may be disposed to be adjacent to another end of the second surface 304 of the flexible circuit film 300. That is, the display panel 100 and the circuit board 200 may be mounted on the second surface 304 of the flexible circuit film 300.

The driving chip 350 may be disposed on a center portion of the flexible circuit film 300. The driving chip 350 may be disposed on panel bonding leads 510a on the first surface 302 of the flexible circuit film 300. A first through-hole region TH1 in which first through-holes 312 are disposed may be formed in the flexible circuit film 300 adjacent to the display panel 100. A second through-hole region TH2 in which second through-holes 314 are disposed may be formed in the flexible circuit film 300 adjacent to the circuit board 200. The present inventive concepts are not limited to structures of the first and second through-holes 312 and 314 and/or the number of the first and second through-holes 312 and 314.

According to some embodiments of the present inventive concepts, the driving chip 350 and the display panel 100 may be electrically connected to each other through the panel bonding leads 510a and 510b. The panel bonding leads 510a and 510b may extend from between the driving chip 350 and the flexible circuit film 300 to cross the first surface 302 of the flexible circuit film 300, extend through the first through-holes 312 onto the second surface 304 of the flexible circuit film 300. The panel bonding leads 510a may extend on the second surface 304 of the flexible circuit film 300 between the flexible circuit film 300 and the panel bumps 520a and 520b. An extending direction of the panel bonding leads 510a and 510b may be a direction from the driving chip 300 to the display panel 100.

The driving chip 350 and the circuit board 200 may be electrically connected to each other through the CB bonding leads 530a and 530b. The CB bonding leads 530a and 530b may extend from between the driving chip 350 and the flexible circuit film 300 to cross the first surface 302 of the flexible circuit film 300, extend through the second through-holes 314 onto the second surface 304 of the flexible circuit film 300. The CB bonding leads 530a may extend on the second surface 304 of the flexible circuit film 300 between the flexible circuit film 300 and the CB bumps 530a and 530b. An extending direction of the CB bonding leads 530a and 530b may be a direction from the driving chip 350 to the circuit board 200.

The flexible circuit film 300 may include a synthetic resin having a plate-shape and flexibility. For example, the flexible circuit film 300 may include polyimide (PI). Referring to FIG. 3B, the flexible circuit film 300 may be bent so that the circuit board 200 connected to one end of the flexible circuit film 300 may be disposed under the display panel 100.

Hereinafter, the panel bonding leads 510a and 510b and the CB bonding leads 530a and 530b will be described in more detail.

Referring to FIGS. 3A and 3B, the panel bonding leads 510a and 510b may electrically connect the driving chip 350 to the display substrate 110. According to some embodiments of the present inventive concepts, the panel bonding leads 510a and 510b may include first panel bonding leads 510a electrically connected to the first panel bumps 520a and second panel bonding leads 510b electrically connected to the second panel bumps 520b. Each of the second panel bonding leads 510b may be disposed between two first panel bonding leads 510a adjacent to each other.

Referring to FIG. 2C, the first panel bonding lead 510a may include a first portion 512 having a first thickness and a second portion 514 having a second thickness smaller than the first thickness. The second portion 514 may be adjacent to the second panel bump 520b. Additionally, the second portion 514 of the first panel bonding lead 510a may be disposed in a region of the second row LN2. Since the second portion 514 of the first panel bonding lead 510a adjacent to the second panel bump 520b formed of a conductive material has the smaller thickness, electrical error between the second panel bump 520b and the first panel bonding lead 510a may be prevented. On the other hand, the second panel bonding lead 510b may have the first thickness without thickness variation.

Referring to FIG. 2D, the CB bonding leads 530a and 530b may electrically connect the driving chip 350 to the circuit board 200. According to some embodiments of the inventive concepts, the CB bonding leads 530a and 530b may include first CB bonding leads 530a electrically connected to the first CB bumps 540a and second CB bonding leads 530b electrically connected to the second CB bumps 540b. Each of the second CB bonding leads 530b may be disposed between two first CB bonding leads 530a adjacent to each other.

The first CB bonding lead 530a, similar to the first panel bonding leads 510a, may include a first portion 512a having a third thickness and a second portion 514a having a fourth thickness smaller than the third thickness. The second portion 514a of the first CB bonding lead 530a may be adjacent to the second CB bump 540b. Additionally, similar to the second portion of the first panel bonding leads 510a, the second portion 514a of the first CB bonding lead 530a may be disposed in a region of the second row LN2 of the CB bonding leads 530a and 530b. Since the second portion 514a of the first CB bonding lead 530a adjacent to the second CB bump 540b formed of a conductive material has the smaller thickness, electrical error between the second CB bump 540b and the first CB bonding lead 530a may be prevented. The second CB bonding lead 530b may have the third thickness without thickness variation.

Hereinafter, an internal structure of the display panel 100 will be described in detail with reference to FIGS. 4 and 5. In more detail, a structure of one pixel in the display region DA will be described.

FIG. 4 is a circuit diagram of one pixel in a display device according to some embodiments of the inventive concepts. FIG. 5 is a cross-sectional view illustrating a display panel of a display device of FIG. 1.

Figure 5:
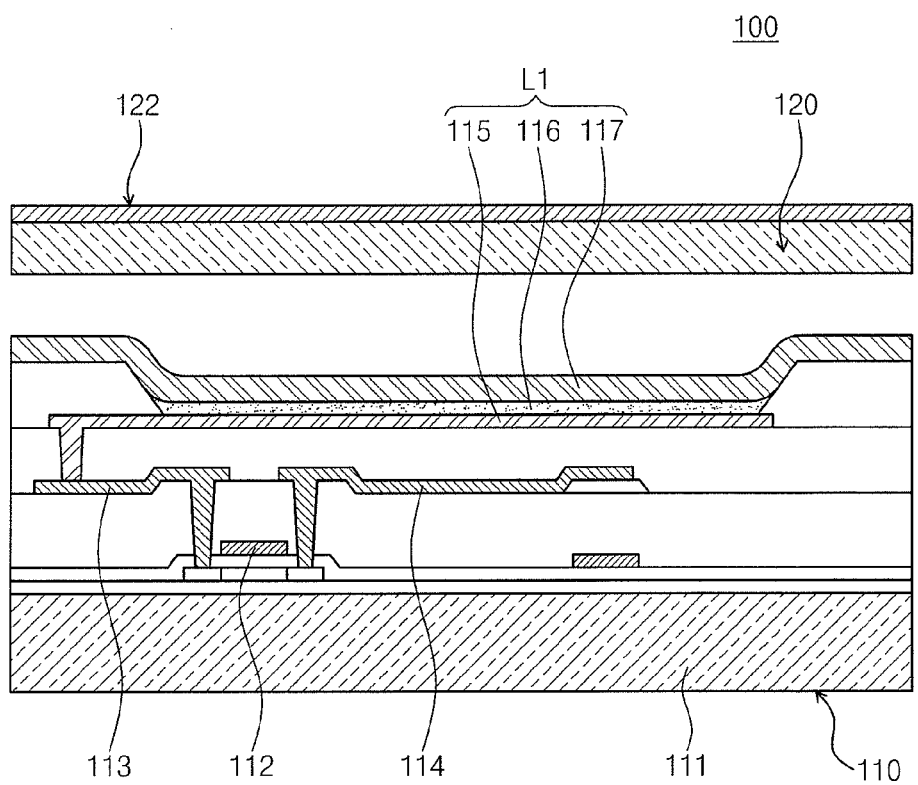
FIG. 5 is a cross-sectional view illustrating a display panel of the display device of FIG. 1 according to some embodiments of the present inventive concepts.

Referring to FIGS. 4 and 5, a pixel may include the organic light emitting element L1 and a driving circuit part DC including thin film transistors T1 and T2 and capacitor C1. The display substrate 110 may include a substrate member 111, and the driving circuit part DC including thin film transistors T1 and T2 and capacitor C1 and the organic light emitting element L1 that are formed on the substrate member 111.

The organic light emitting element L1 may include an anode electrode 115, an organic light emitting layer 116, and a cathode electrode 117. The driving part T1, T2 and C1 may include at least two thin film transistors T1 and T2 and at least one storage capacitor C1. The at least two thin film transistors T1 and T2 may include a switching transistor T1 and a driving transistor T2.

The switching transistor T1 may be connected to a scan line SL1 and a data line DL1. The switching transistor T1 may transfer a data voltage inputted from the data line DL1 to the driving transistor T2 by a switching voltage inputted to the scan line SL1. The storage capacitor C1 may be connected to the switching transistor T1 and a power line VDD. The storage capacitor C1 may store a voltage corresponding to a voltage difference between the voltage transferred from the switching transistor T1 and a voltage applied to the power line VDD.

The driving transistor T2 may be connected to the power line VDD and the storage capacitor C1 may supply an output current $I_{OLED}$ proportional to the square of a difference between the voltage stored in the storage capacitor C1 and a threshold voltage of the driving transistor T2 to the organic light emitting element L1, and the organic light emitting element L1 may emit light by the output current $I_{OLED}$. The driving transistor T2 may include a source electrode 114, a drain electrode 113, and a gate electrode 112. The anode electrode 115 of the organic light emitting element L1 may be connected to the drain electrode 113 of the driving transistor T2. The structure of the pixel is not limited to the structure described above. The structure of the pixel may be variously modified.

The sealing substrate 120 may cover the display substrate 110 on which the organic light emitting element L1 and the driving circuit part DC including thin film transistors T1 and T2 and capacitor C1 are formed. Additionally, a polarization member 122 may be formed on the sealing substrate 120 in order to inhibit external light from being reflected. Embodiments of the present inventive concepts are not limited thereto. In other embodiments, the polarization member 122 may be formed under the sealing substrate 120 or on the organic light emitting element L1. In still other embodiments, the polarization member 122 may be omitted.

According to embodiments of the present inventive concepts, a portion of the panel bonding lead adjacent to the panel bump has a thickness smaller than that of another portion of the panel bonding lead. Thus, an interference phenomenon between the panel bump and the panel bonding lead may be reduced or minimized. As a result, electrical error between the panel bump and the panel bonding lead may be prevented.

In addition, according to embodiments of the present inventive concepts, a portion of the CB bonding lead adjacent to the CB bump has a thickness smaller than that of another portion of the CB bonding lead. Thus, an interference phenomenon between the CB bump and the CB bonding lead may be reduced or minimized. As a result, electrical error between the CB bump and the CB bonding lead may be prevented.

While the inventive concepts have been described with reference to example embodiments, it will be apparent to those skilled in the art that various changes and modifications may be made without departing from the spirits and scopes of the present inventive concepts. Therefore, it should be understood that the above example embodiments are not limiting, but illustrative. Thus, the scopes of the present inventive concepts are to be determined by the broadest permissible interpretation of the following claims and their equivalents, and shall not be restricted or limited by the foregoing description.

What is claimed is:
1. A display device comprising:
a display panel comprising a plurality of panel bumps;
a flexible circuit film connected to the display panel;
a chip on the flexible circuit film; and
a plurality of panel bonding leads electrically connecting the display panel to the chip and extending in one direction,
wherein the panel bumps comprise:
first panel bumps spaced apart from each other along a first row of panel bumps; and second panel bumps spaced apart from each other along a second row of panel bumps, the second row of panel bumps spaced apart from the first row of panel bumps toward the chip, wherein each of the second panel bumps is between two adjacent first panel bumps in a column direction perpendicular to a row direction of the first and second rows of panel bumps, wherein the panel bonding leads comprise:
  first panel bonding leads connected to the first panel bumps; and
  second panel bonding leads connected to the second panel bumps, ends of the second panel bonding leads connected to the second panel bumps being spaced apart from ends of the first panel bonding leads connected to the first panel bumps toward the chip, and wherein each of the first panel bonding leads comprises:
  a first portion having a first thickness; and
  a second portion having a second thickness smaller than the first thickness, the second portions of the first panel bonding leads being adjacent to the second panel bumps.

2. The display device of claim 1, wherein each of the second panel bonding leads comprises the first thickness.

3. The display device of claim 1, further comprising:
a circuit board connected to the flexible circuit film, the circuit board including a plurality of circuit board (CB) bumps; and
circuit board (CB) bonding leads electrically connecting the chip to the circuit board,
wherein the CB bumps comprise:
  first CB bumps spaced apart from each other along a first row of CB bumps; and
  second CB bumps spaced apart from each other along a second row of CB bumps, the second row of CB bumps spaced apart from the first row of the CB bumps toward the chip,
wherein each of the second CB bumps is between two adjacent first CB bumps in a column direction perpendicular to a row direction of the first and second rows of the CB bumps,
wherein the CB bonding leads comprise:
  first CB bonding leads connected to the first CB bumps; and
  second CB bonding leads connected to the second CB bumps, and
wherein each of the first CB bonding leads comprises:
  a first portion having a third thickness; and
  a second portion having a fourth thickness smaller than the third thickness, the second portions of the first CB bonding leads being adjacent to the second CB bumps.

4. The display device of claim 3, wherein each of the second CB bonding leads comprises the third thickness.

5. The display device of claim 3, wherein the flexible circuit film is bent so that the display panel and the circuit board face each other.

6. A display device comprising:
a display panel comprising a plurality of panel bumps;
a circuit board comprising a plurality of circuit board (CB) bumps, the circuit board facing and spaced apart from the display panel;
a bent flexible circuit film electrically connecting the display panel to the circuit board;
a chip on the bent flexible circuit film;
panel bonding leads electrically connecting the panel bumps to the chip; and
circuit board (CB) bonding leads electrically connecting the CB bumps to the chip,
wherein the plurality of panel bumps comprise:
  first panel bumps spaced apart from each other along a first row of panel bumps; and
  second panel bumps spaced apart from each other along a second row of panel bumps, the second row of panel bumps spaced apart from the first row of panel bumps toward the chip,
wherein each of the second panel bumps is between two adjacent first panel bumps in a column direction perpendicular to a row direction of the first and second rows,
wherein the panel bonding leads comprise:
  first panel bonding leads connected to the first panel bumps; and
  second panel bonding leads connected to the second panel bumps,
wherein each of the first panel bonding leads comprises:
  a first portion having a first thickness; and
  a second portion having a second thickness smaller than the first thickness, the second portions of the first panel bonding leads being adjacent to the second panel bumps, and
wherein each of the second panel bonding leads comprises the first thickness for the entire length of the second panel bonding leads.

7. The display device of claim 6, wherein the CB bumps comprise:
  first CB bumps spaced apart from each other along a first row of CB bumps; and
  second CB bumps spaced apart from each other along a second row of CB bumps, the second row of CB bumps spaced apart from the first row of the CB bumps toward the chip,
wherein each of the second CB bumps is between two adjacent first CB bumps in a column direction perpendicular to a row direction of the first and second rows of the CB bumps,
wherein the CB bonding leads comprise:
  first CB bonding leads connected to the first CB bumps; and second CB bonding leads connected to the second CB bumps, and
wherein each of the first CB bonding leads comprises:
  a first portion having a third thickness; and
  a second portion having a fourth thickness smaller than the third thickness, the second portions of the first CB bonding leads being adjacent to the second CB bumps.

8. The display device of claim 7, wherein each of the second CB bonding leads has the third thickness.

9. A display device comprising:
a display panel comprising a plurality of panel bumps;
a flexible circuit film connected to the display panel;
a chip on the flexible circuit film; and
a plurality of panel bonding leads electrically connecting the display panel to the chip,
wherein the panel bumps comprise:
  first panel bumps spaced apart from each other along a first row of panel bumps along a row direction; and
  second panel bumps spaced apart from each other along a second row of panel bumps, the second row of panel bumps spaced apart from the first row of panel bumps in a column direction, the first and second panel bumps being in a zigzag pattern, alternating between the second panel bumps in the second row of panel bumps and the first panel bumps in the first row of panel bumps, wherein the panel bonding leads comprise:
first panel bonding leads connected to the first panel bumps; and
second panel bonding leads connected to the second panel bumps, wherein a thickness of a portion of the first panel bonding leads adjacent to the second panel bumps is smaller than a thickness of the remainder of the first panel bonding leads, and wherein each of the second panel bonding leads comprises the same thickness as the remainder of the first panel bonding leads for the entire length of the second panel bonding leads.

10. The display device of claim 9, further comprising:
a circuit board connected to the flexible circuit film, the circuit board including a plurality of circuit board (CB) bumps; and
circuit board (CB) bonding leads electrically connecting the chip to the circuit board, wherein the CB bumps comprise:
first CB bumps spaced apart from each other along a first row of CB bumps in a row direction; and
second CB bumps spaced apart from each other along a second row of CB bumps in a row direction, the second row of CB bumps spaced apart from the first row of the CB bumps in a column direction, the first and second CB bumps being in a zigzag pattern, alternating between the second CB bumps in the second row of CB bumps and the first CB bumps in the first row of CB bumps, wherein the CB bonding leads comprise:
first CB bonding leads connected to the first CB bumps; and
second CB bonding leads connected to the second CB bumps, and wherein a thickness of a portion of the first CB bonding leads adjacent to the second CB bumps is smaller than a thickness of the remainder of the first CB bonding leads.

11. The display device of claim 10, wherein each of the second CB bonding leads comprises the same thickness as the remainder of the first CB bonding leads.

12. The display device of claim 10, wherein the flexible circuit film is bent so that the display panel and the circuit board face each other.

13. The display device of claim 9, wherein the display panel comprises a display substrate and a sealing substrate.

14. The display device of claim 13, wherein the display substrate comprises a display region and a mounting region.

15. The display device of claim 14, wherein the plurality of panel bumps are on the mounting region.

16. The display device of claim 14, further comprising a plurality of pixels in a matrix on the display region.

17. The display device of claim 16, wherein the plurality of pixels comprise an organic light emitting element and a driving circuit part.

18. The display device of claim 17, wherein the driving circuit part comprises a plurality of thin film transistors and at least one capacitor.

* * * * *